(12) United States Patent
Lee et al.

(10) Patent No.: US 8,264,141 B2
(45) Date of Patent: Sep. 11, 2012

(54) ORGANIC LIGHT EMITTING DISPLAY AND METHOD OF MANUFACTURING THE SAME

(75) Inventors: Jaeyoung Lee, Jung-ri (KR); Hyodae Bae, Daegu (KR); Hanki Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 261 days.

(21) Appl. No.: 12/329,057

(22) Filed: Dec. 5, 2008

(65) Prior Publication Data

US 2010/0060145 A1    Mar. 11, 2010

(30) Foreign Application Priority Data

Sep. 5, 2008   (KR) .................. 10-2008-0087697

(51) Int. Cl.
*H01J 1/62*       (2006.01)
*H01J 63/04*      (2006.01)

(52) U.S. Cl. ......... 313/504; 313/496; 313/503; 313/506
(58) Field of Classification Search ........... 313/498–512
See application file for complete search history.

(56) References Cited

U.S. PATENT DOCUMENTS

| 2002/0057050 A1* | 5/2002 | Shi ................... 313/504 |
| 2003/0234608 A1* | 12/2003 | Lee et al. ............ 313/504 |
| 2004/0124766 A1* | 7/2004 | Nakagawa et al. ...... 313/504 |
| 2004/0239238 A1* | 12/2004 | Lee ................... 313/504 |
| 2007/0205411 A1* | 9/2007 | Itai .................... 257/40 |
| 2007/0207346 A1* | 9/2007 | Saitoh et al. ......... 428/690 |
| 2007/0228360 A1* | 10/2007 | Zhu et al. ............. 257/40 |
| 2007/0228939 A1* | 10/2007 | Yoshida ............... 313/504 |

FOREIGN PATENT DOCUMENTS

CN          1468038 A       1/2004

OTHER PUBLICATIONS

Office Action issued in corresponding Chinese Patent Application No. 200810179061.3; Jul. 1, 2010.

* cited by examiner

*Primary Examiner* — Anh Mai
*Assistant Examiner* — Kevin Quarterman
(74) *Attorney, Agent, or Firm* — Brinks Hofer Gilson & Lione

(57) ABSTRACT

An organic light emitting display is provided. The organic light emitting display comprises: a substrate; an anode that is positioned on the substrate; a sub-anode that is positioned on the anode and that is formed with a metallic oxide and nickel (Ni); an organic light emitting layer that is positioned on the sub-anode; and a cathode that is positioned on the organic light emitting layer.

2 Claims, 6 Drawing Sheets

US 8,264,141 B2

ORGANIC LIGHT EMITTING DISPLAY AND METHOD OF MANUFACTURING THE SAME

RELATED APPLICATIONS

This application claims the benefit of Korean Patent Application No. 10-2008-087697 filed on Sep. 5, 2008 which is hereby incorporated by reference in its entirety.

BACKGROUND

1. Field

This disclosure relates to an organic light emitting display and a method of manufacturing the same.

2. Related Art

An organic light emitting element used for an organic light emitting display is a self-luminant element in which a light emitting layer is formed between two electrodes positioned on a substrate.

The organic light emitting display is divided into a top-emission type, a bottom-emission type, and a dual-emission type according to a light emission direction. The organic light emitting display is divided into a passive matrix type and an active matrix type according to a driving method.

In general, a subpixel in the organic light emitting display comprises an anode, an organic light emitting layer, and a cathode.

Conventionally, in the subpixel comprised in the organic light emitting display, in order to maximize an injection effect of a hole, a hole injection layer and a hole transport layer are formed between an anode and a cathode. In order to maximize an injection effect of a hole, a work function between the anode and the hole injection layer plays an important role.

Accordingly, conventionally, in order to maximize an injection effect of a hole, a method of forming a buffer layer between the anode and the hole injection layer has been proposed.

SUMMARY

In an aspect, an organic light emitting display comprises: a substrate; an anode that is positioned on the substrate; a sub-anode that is positioned on positioned on the anode and that is formed with a metallic oxide and nickel (Ni); an organic light emitting layer that is positioned on the sub-anode; and a cathode that is positioned on the organic light emitting layer.

In another aspect, an organic light emitting display comprises: a substrate; a cathode that is positioned on the substrate; an organic light emitting layer that is positioned on the cathode; a sub-anode that is positioned on the organic light emitting layer and that is formed with a metallic oxide and nickel (Ni); and an anode that is positioned on the sub-anode.

In another aspect, a method of manufacturing an organic light emitting display, comprises: forming a transistor on a substrate; forming an anode on the transistor; forming a sub-anode that is formed with a metallic oxide and nickel (Ni) on the anode; forming an organic light emitting layer on the sub-anode; and forming a cathode on the organic light emitting layer.

In another aspect, a method of manufacturing an organic light emitting display, comprises: forming a transistor on a substrate; forming a cathode on the transistor; forming an organic light emitting layer on the cathode; forming a sub-anode that is formed with a metallic oxide and nickel (Ni) on the organic light emitting layer; and forming an anode on the sub-anode.

BRIEF DESCRIPTION OF THE DRAWINGS

The accompany drawings, which are comprised to provide a further understanding of the present disclosure and are incorporated on and constitute a part of this specification illustrate embodiments of the present disclosure and together with the description serve to explain the principles of the present disclosure.

DETAILED DESCRIPTION OF THE DRAWINGS AND THE PRESENTLY PREFERRED EMBODIMENTS

Reference will now be made in detail embodiments of the present disclosure examples of which are illustrated in the accompanying drawings.

An embodiment of this disclosure is described hereinafter in detail with reference to the accompanying drawings.

<First Embodiment>

Figure 1:
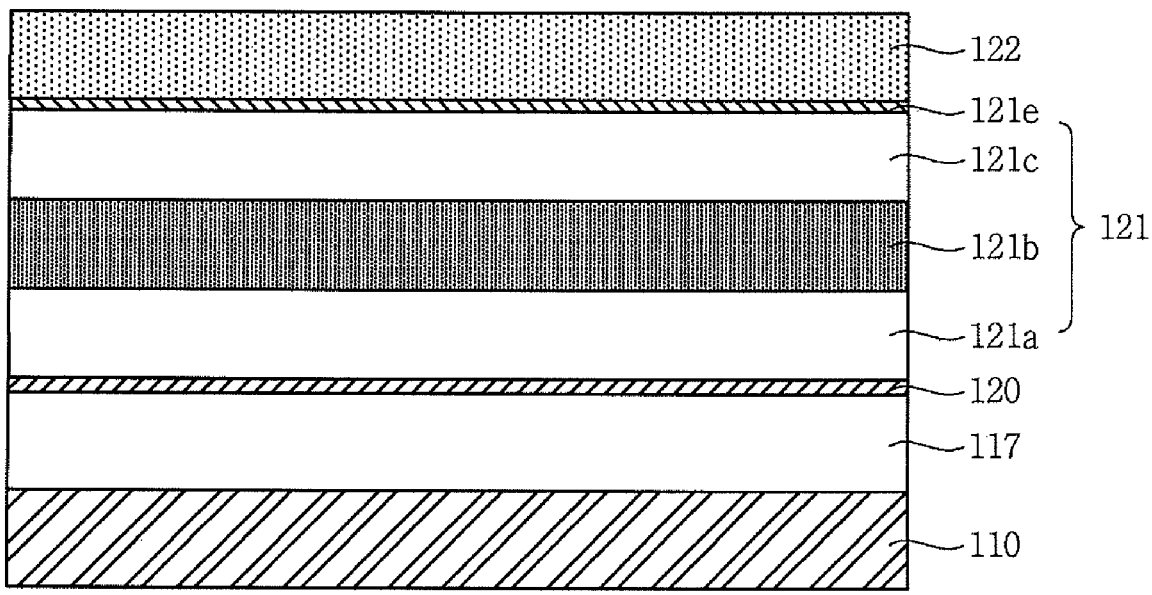
FIG. 1 is a cross-sectional view of an organic light emitting display according to a first embodiment of this disclosure.

Referring to FIG. 1, an organic light emitting display according to the first embodiment of this disclosure comprises a substrate 110. The organic light emitting display comprises an anode 117 that is positioned on the substrate 110. The organic light emitting display comprises a sub-anode 120 that is positioned on the anode 117 and that is formed with a metallic oxide and nickel (Ni). The organic light emitting display comprises an organic light emitting layer 121 that is positioned on the sub-anode 120. Further, the organic light emitting display comprises a cathode 122 that is positioned on the organic light emitting layer 121.

The anode 117 that is positioned on the substrate 110 is formed with a metallic oxide, such as an indium tin oxide (ITO), an indium zinc oxide (IZO), and an indium tin zinc oxide (ITZO). In the first embodiment, the anode 117 is formed with an IZO.

The sub-anode 120 that is positioned on the anode 117 is formed with a metallic oxide and nickel.

The sub-anode 120 is formed with an IZO, i.e. the same metallic oxide as that of the anode 117, but may be formed with a metallic oxide in which nickel is added to the IZO. However, the sub-anode 120 may be formed with a metallic oxide of a different kind from that of the anode 117. The sub-anode 120 together with the anode 117 can secure low surface resistance and high transmittance characteristics and can supply a high work function due to "NiOx" in added nickel, thereby improving an injection effect of a hole. The sub-anode 120 may have a thickness smaller than that of the anode 117.

In an exemplary embodiment, the organic light emitting layer 121 that is positioned on the sub-anode 120 has a structure of comprising a hole injection layer 121a, a hole transport layer 121b, a light emitting layer 121c, and an electron injection layer 121e, but the organic light emitting layer 121 is not limited thereto and may further comprise an electron transport layer.

The cathode 122 that is positioned on the organic light emitting layer 121 may be formed with aluminum (Al), aluminum alloy (Al alloy), aluminum neodymium (AlNd), etc.

<Second Embodiment>

Figure 2:
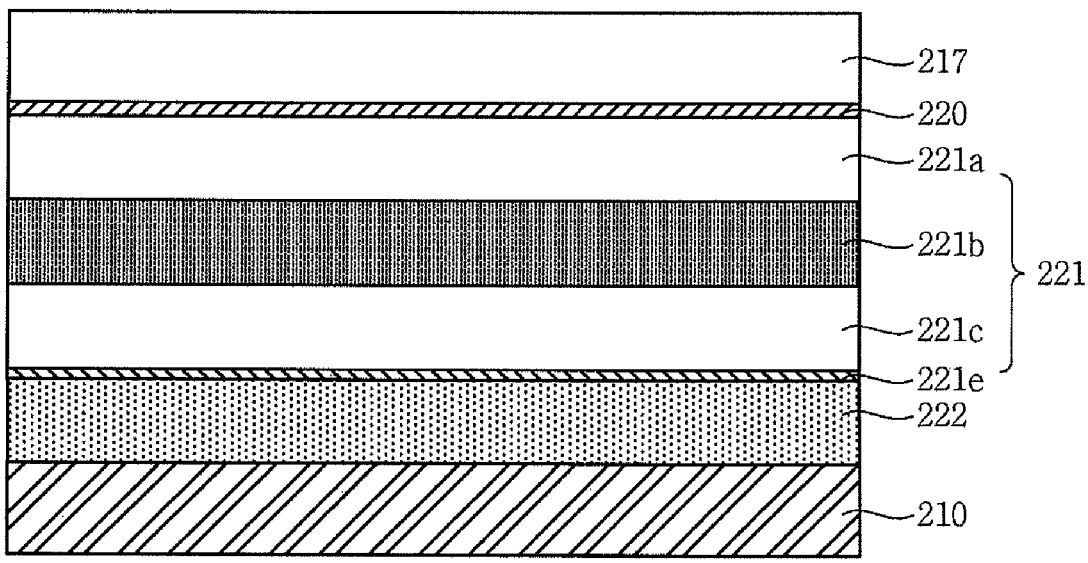
FIG. 2 is a cross-sectional view of an organic light emitting display according to a second embodiment of this disclosure.

Referring to FIG. 2, an organic light emitting display according to the second embodiment of this disclosure comprises a substrate 210. The organic light emitting display may comprise a cathode 222 that is positioned on the substrate 210. The organic light emitting display comprises an organic light emitting layer 221 that is positioned on the cathode 222. The organic light emitting display comprises a sub-anode 220 that is positioned on the organic light emitting layer 221 and that is formed with a metallic oxide and nickel (Ni). Further, the organic light emitting display comprises an anode 217 that is positioned on the sub-anode 220.

The cathode 222 that is positioned on the substrate 210 may be formed with aluminum (Al), aluminum alloy (Al alloy), and aluminum neodymium (AlNd), etc.

In an exemplary embodiment, the organic light emitting layer 221 that is positioned on the cathode 222 has a structure of comprising a hole injection layer 221a, a hole transport layer 221b, a light emitting layer 221c, and an electron injection layer 221e, but the organic light emitting layer 221 is not limited thereto and may further comprise an electron transport layer.

The sub-anode 220 that is positioned on the organic light emitting layer 221 may be formed with a metallic oxide and nickel.

The anode 217 may be formed with a metallic oxide, such as an ITO, an IZO, and an ITZO. In the second embodiment, the anode 217 is formed with the IZO.

The sub-anode 220 is formed with the IZO, i.e. the same metallic oxide as that of the anode 217, but may be formed with a metallic oxide in which nickel is added to the IZO. However, the sub-anode 220 may be formed with a metallic oxide of a different kind from that of the anode 217. The sub-anode 220 together with the anode 217 can secure low surface resistance and high transmittance characteristics and can supply a high work function due to "NiOx" in added nickel, thereby improving an injection effect of a hole. The sub-anode 220 may have a thickness smaller than that of the anode 217.

<Third Embodiment>

Figure 3:
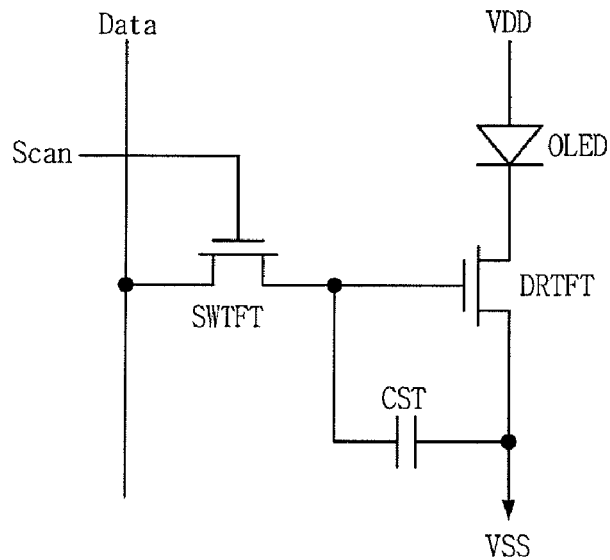
FIG. 3 is a circuit diagram illustrating a circuit configuration of a subpixel.

Referring to FIG. 3, a circuit of the subpixel is formed as follows.

The subpixel comprises a switching transistor (SWTFT) in which a gate is connected to a scan wiring and whose one end is connected to a data wiring. The subpixel comprises a driving transistor (DRTFT) whose gate is connected to the other end of the SWTFT and whose one end is connected to a second power wiring (VSS). The subpixel comprises a capacitor (CST) that is connected between the gate of the DRTFT and the VSS. Further, the subpixel comprises an organic light emitting diode (OLED) whose anode is connected to a first power wiring (VDD) and whose cathode is connected to the other end of the DRTFT.

An organic light emitting display according to a third embodiment of this disclosure illustrates an organic light emitting display in which the SWTFT is comprised in the subpixel and in which the DRTFT is an N-type, but is not limited thereto.

In such a subpixel structure, when a data signal and a scan signal are supplied from a data driver and a scan driver, a current that is applied to the VDD flows through the VSS, and the OLED emits light and thus an image can be expressed.

Figure 4:
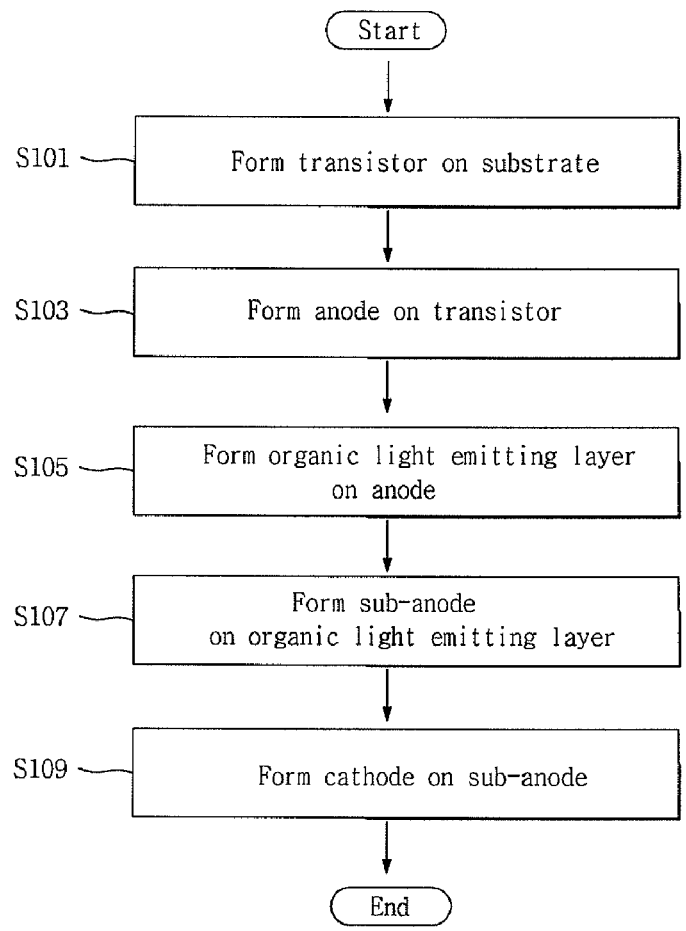
FIG. 4 is a flowchart illustrating a method of manufacturing an organic light emitting display according to a third embodiment of this disclosure.
Figure 5:
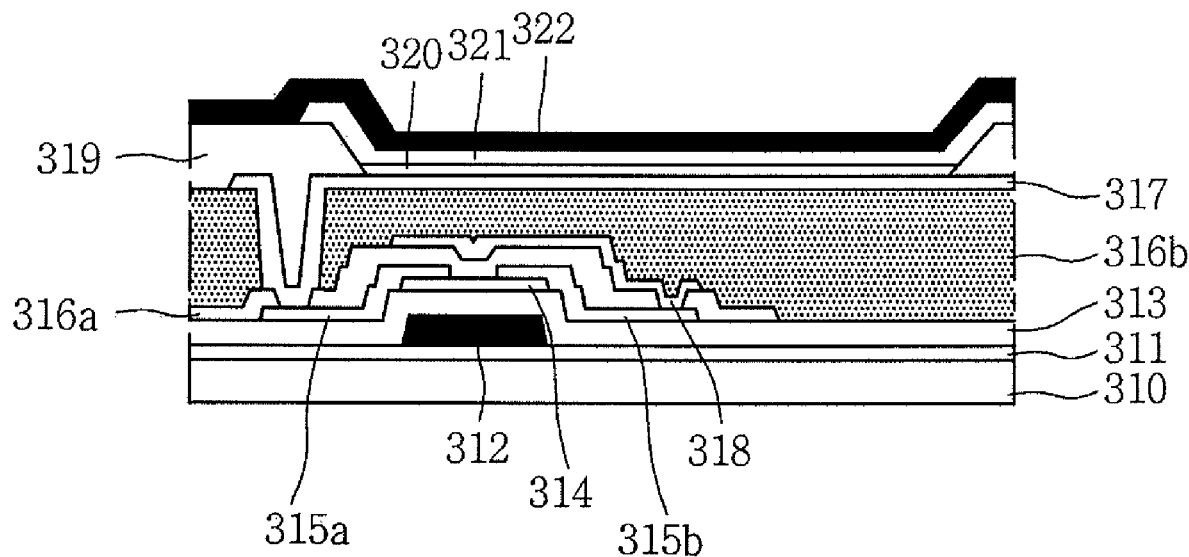
FIG. 5 is a cross-sectional view of a subpixel illustrating the method of FIG. 4.

Referring to FIGS. 4 and 5, a method of manufacturing of the organic light emitting display according to the third embodiment of this disclosure is described as follows.

A transistor is formed on a substrate 310 (S101).

The substrate 310 is made of a material having excellent mechanical strength or size stability among materials for forming an element. The substrate 310 may use, as a material, for example, a glass plate, a metal plate, a ceramic plate, or a plastic plate (a polycarbonate resin, an acrylic resin, a vinyl chloride resin, a polyethylene terephthalate resin, a polyimide resin, a polyester resin, an epoxy resin, a silicon resin, a fluorine resin, etc.).

A buffer layer 311 is formed on the substrate 310. The buffer layer 311 is formed to protect a transistor to be formed in the following process from impurities such as alkali ions discharged from the substrate 310. The buffer layer 311 may use a silicon oxide film (SiOx), a silicon nitride film (SiNx), etc.

A gate 312 is formed on the buffer layer 311. The gate 312 may be formed with any one selected from a group consisting of molybdenum (Mo), aluminum (Al), chrome (Cr), gold (Au), titanium (Ti), nickel (Ni), neodymium (Nd), and copper (Cu), or alloys thereof. Further, the gate 312 may be a multiple layer that is formed with any one selected from a group consisting of molybdenum (Mo), aluminum (Al), chrome (Cr), gold (Au), titanium (Ti), nickel (Ni), neodymium (Nd), and copper (Cu), or alloys thereof. Further, the gate 312 may be a double layer of molybdenum/aluminum-neodymium or molybdenum/aluminum.

A first insulating film 313 is formed on the gate 312. The first insulating film 313 may be a silicon oxide film (SiOx), a silicon nitride film (SiNx), or a multiple layer thereof, but is not limited thereto.

An active layer 314 is formed on the first insulating film 313. The active layer 314 may comprise amorphous silicon or polycrystalline silicon in which the amorphous silicon is crystallized. Although not shown in FIG. 5, the active layer 314 may comprise a channel region, a source region, and a drain region, and P-type or N-type impurities may be doped in the source region and the drain region. Further, the active layer 314 may comprise an ohmic contact layer for lowering contact resistance.

A source 315a and a drain 315b are formed on the active layer 314. The source 315a and the drain 315b may be formed in a single layer or a multiple layer, and when the source 315a and the drain 315b are formed in a single layer, the source 315a and the drain 315b may be formed with any one selected from a group consisting of molybdenum (Mo), aluminum (Al), chrome (Cr), gold (Au), titanium (Ti), nickel (Ni), neodymium (Nd), and copper (Cu), or alloys thereof. Further, when the source 315a and the drain 315b are formed in a multiple layer, the source 315a and the drain 315b may be formed in a double layer of molybdenum/aluminum-neodymium, or a triple layer of molybdenum/aluminum/molybdenum or molybdenum/aluminum-neodymium/molybdenum.

A second insulating film 316a is formed on the source 315a and the drain 315b. The second insulating film 316a may be a silicon oxide film (SiOx), a silicon nitride film (SiNx), or a multiple layer thereof, but is not limited thereto. The second insulating film 316a may be a passivation film.

The gate 312, the source 315a, and the drain 315b among transistors positioned on the substrate 310 are a driving transistor. One of the source 315a and the drain 315b of the driving transistor may be connected to a shield metal 318 positioned on the second insulation film 316a. The shield metal 318 may be omitted according to a structure.

A third insulation film 316b for increasing flatness may be formed on the second insulation film 316a. The third insulation film 316b may be made of an organic material such as polyimide, but is not limited thereto.

A transistor that is positioned on the substrate 310 is a bottom gate type, but the transistor may be a top gate type.

Next, an anode 317 is formed on the transistor (S103).

The anode 317 may be formed to be connected to the source 315a or the drain 315b of the transistor on the third insulating film 316b that is positioned on the transistor. The anode 317 may be formed to be divided on a subpixel basis. The anode 317 may be formed with a metallic oxide, for example, an ITO, an IZO, and an ITZO. In the third embodiment, the anode 317 is formed with the IZO.

After the anode 317 is formed, a bank layer 319 for exposing the anode 317 is formed. The bank layer 319 may be made of an organic material such as a benzocyclobutene (BCB)-based resin, an acryl-based resin, or a polyimide resin, but is not limited thereto.

Next, a sub-anode 320 that is formed with a metallic oxide and nickel (Ni) is formed on the anode 317 (S105).

When the sub-anode 320 is formed on the anode 317 that is exposed through the bank layer 319, a dual target DC sputtering system may be used.

Figure 6:
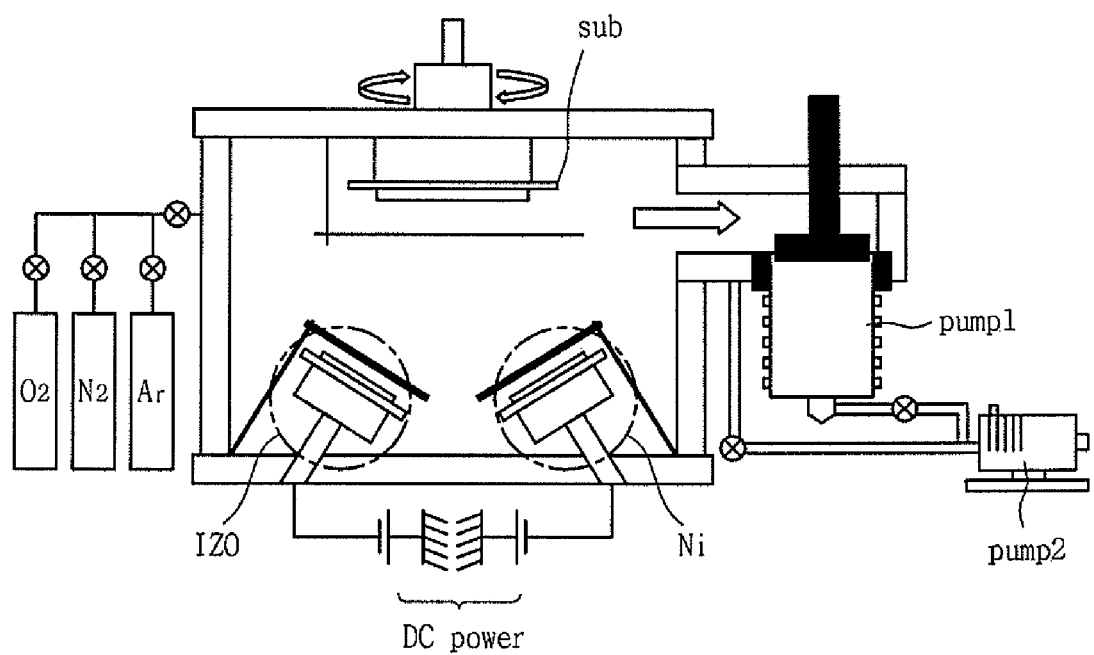
FIG. 6 is a diagram illustrating a configuration of a dual target direct current (DC) sputtering system.

Referring to FIG. 6, in the shown sputtering system, two targets IZO and Ni are connected to a substrate sub and DC power, and the sputtering system comprises a diffusion pump pump1, a rotary pump pump2, etc. In the sputtering system, if a gas such as oxygen ($O_2$), nitrogen ($N_2$), argon (Ar) is injected into a chamber and DC power is applied to the two targets IZO and Ni, a material positioned at the two targets IZO and Ni may be formed in the substrate sub. Here, the IZO of the two targets may use an IZO comprising an indium oxide ($In_2O_3$) of about 5 wt %, and Ni of the two targets may use Ni of purity 99.99%.

In the sputtering system, in order to form the IZO and nickel (Ni) selected for the sub-anode 320, a process condition of a pressure: 5 mTorr, Ar gas: 20 sccm, TS: 100 mm, DC power of the IZO: 1000 W, and DC power of Ni: 0 to 7 W may be set, but is not limited thereto.

The anode 317 that is formed on the transistor may be also formed using the sputtering system. In the sputtering system, in order to form the IZO selected for the anode 317, a process condition of the IZO having a pressure: 5 mTorr, a DC power: 1000 W, Ar gas: 20 sccm, and TS: 100 mm may be set, but is not limited thereto.

In the third embodiment of this document, the sub-anode 320 is formed with an IZO, i.e. the same metallic oxide as that of the anode 317, but may be formed with a metallic oxide in which nickel is added to the IZO. However, the sub-anode 320 may be formed with a metallic oxide of a different kind from that of the anode 317, and may be formed with a metallic oxide to which a metal other than nickel is added.

Next, an organic light emitting layer 321 is formed on the sub-anode 320 (S107).

In an example of an embodiment, the organic light emitting layer 321 may be formed in a structure of comprising a hole injection layer, a hole transport layer, a light emitting layer, and an electron injection layer. Although not shown in FIG. 6, the organic light emitting layer 321 may comprise an electron transport layer.

Next, a cathode 322 is formed on the organic light emitting layer 321 (S109).

The cathode 322 that is positioned on the organic light emitting layer 321 may be formed with aluminum (Al), aluminum alloy (Al alloy), aluminum neodymium (AlNd), etc., but is not limited thereto.

As described above, by forming the sub-anode 320 on the anode 317, if the anode 317 is formed in a double layer structure, low surface resistance and high transmittance characteristic can be secured, and due to "NiOx" in added nickel, a high work function can be provided, and thus an injection effect of a hole can be improved.

Figure 7:
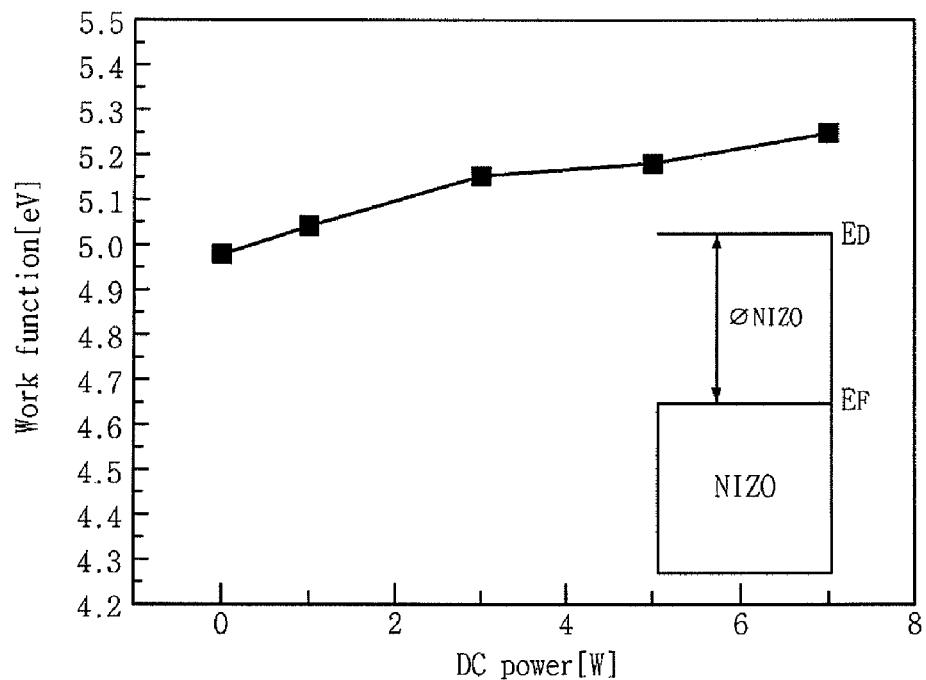
FIG. 7 is a graph illustrating a relationship between a work function and DC power according to a third embodiment of this disclosure.

Referring to FIG. 7, when forming the sub-anode 320 in the manufacturing process, by increasing DC power applied to Ni, an amount of nickel added to an IZO increases and thus a work function also increases. Accordingly, as an amount of nickel added to an IZO increases, a work function also increases and thus a work function of the sub-anode 320 may be adjusted. In consideration of a transmittance, the sub-anode 320 may have a thickness smaller than that of the anode 317.

Figure 8:
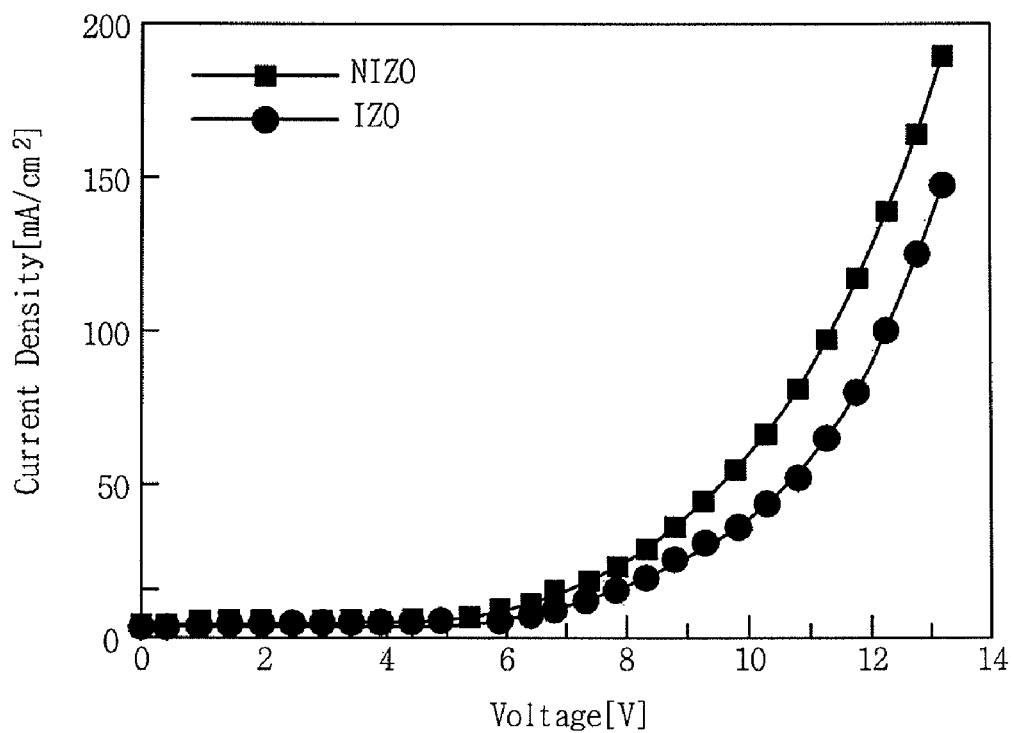
FIG. 8 is a graph illustrating current density of an element according to a third embodiment of this document.
Figure 9:
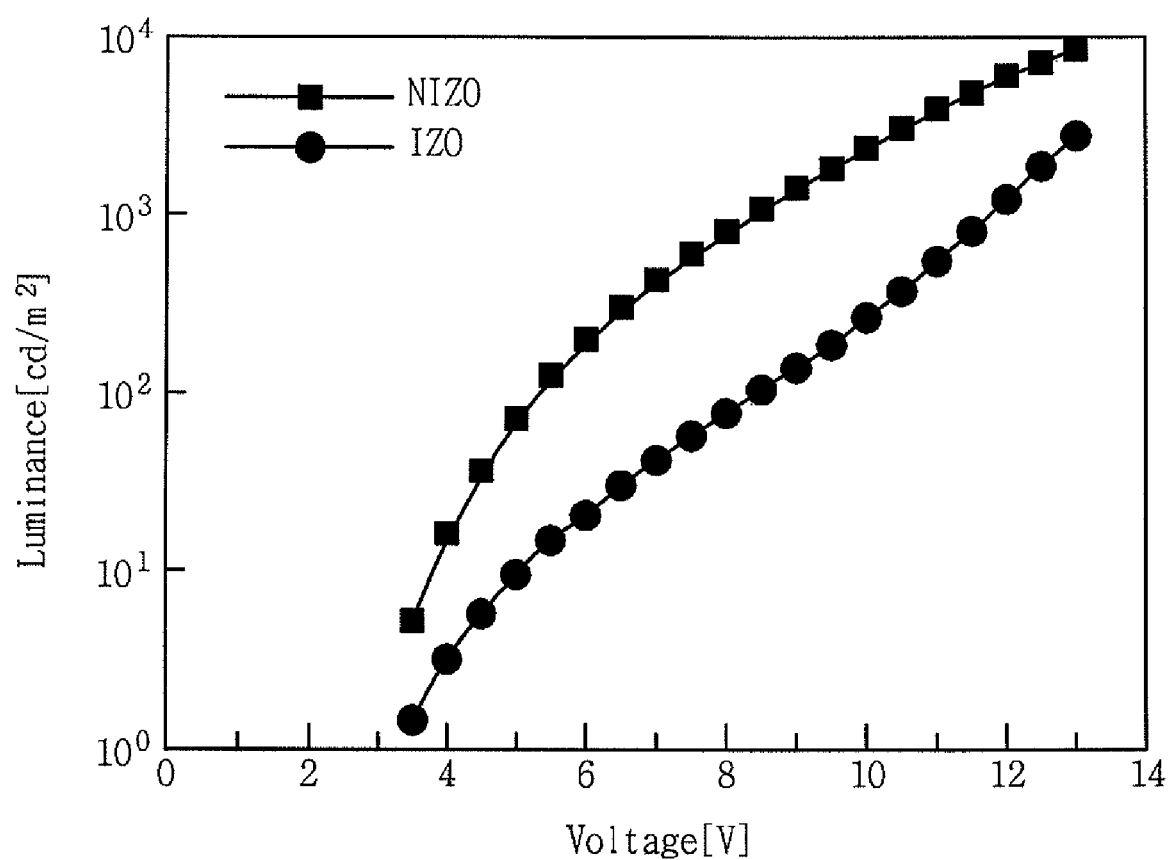
FIG. 9 is a graph illustrating a luminance characteristic of an element according to a third embodiment of this disclosure.

Referring to FIGS. 8 and 9, when manufacturing an organic light emitting display with an element according to the third embodiment of this document, it can be seen that current density and a luminance characteristic are improved by a double anode structure.

<Fourth Embodiment>

Figure 10:
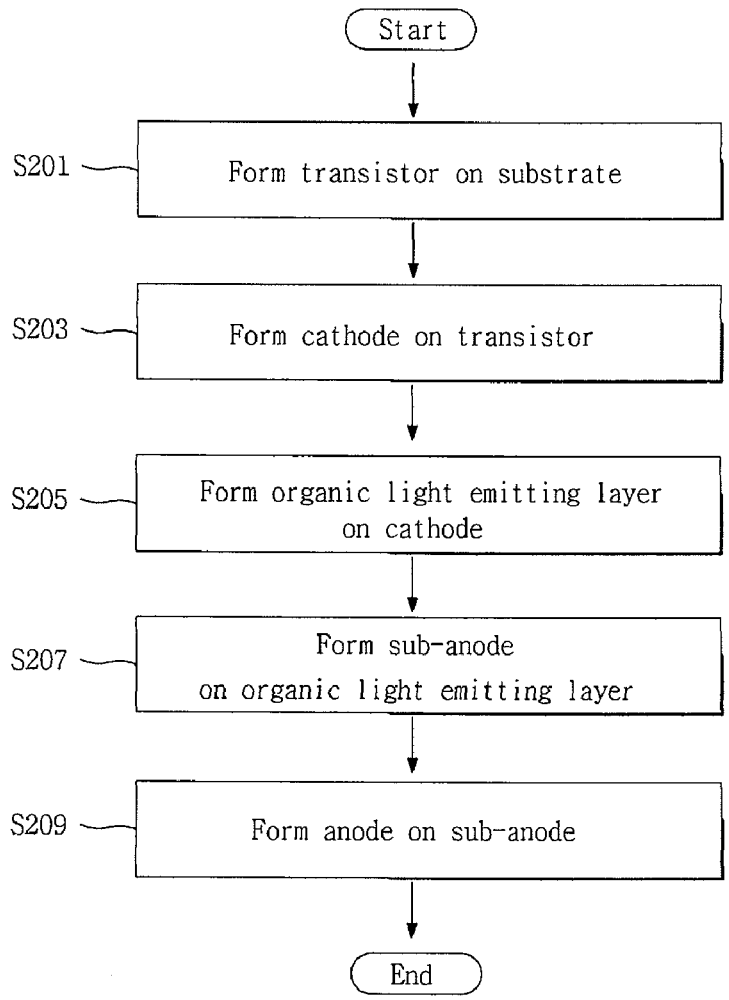
FIG. 10 is a flowchart illustrating a method of manufacturing an organic light emitting display according to a fourth embodiment of this disclosure.
Figure 11:
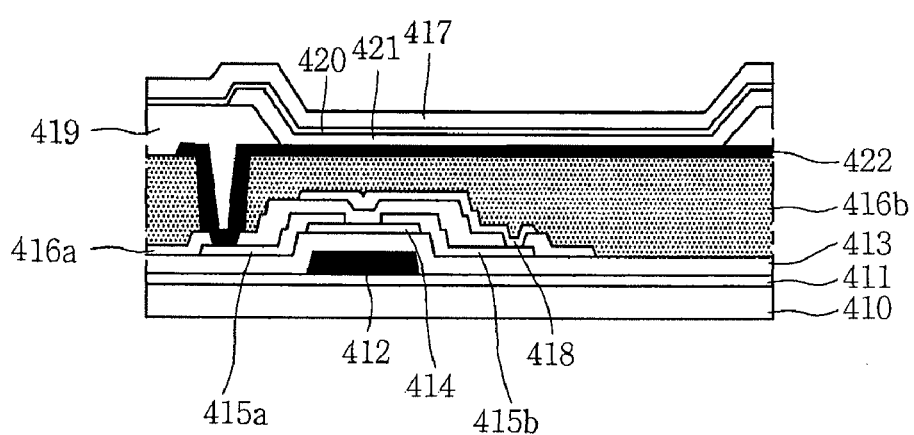
FIG. 11 is a cross-sectional view of a subpixel illustrating the method of FIG. 10.

Referring to FIGS. 10 and 11, a method of manufacturing an organic light emitting display according to the fourth embodiment of this disclosure is described as follows.

First, a transistor is formed on the substrate 410 (S201).

A buffer layer 411 is formed on the substrate 410. A gate 412 is formed on the buffer layer 411. A first insulating film 413 is formed on the gate 412. An active layer 414 is formed on the first insulating film 413. A source 415a and a drain 415b are formed on the active layer 414. A second insulating film 416a is formed on the source 415a and the drain 415b. A shield metal 418 is formed to be connected to the source 415a or the drain 415b on the second insulating film 416a. A third insulating film 416b is formed on the source 415a and the drain 415b. The shield metal 418 may be omitted according to a structure.

Next, a cathode 422 is formed on the transistor (S203).

The cathode 422 may be formed to be connected to the source 415a or the drain 415b on the third insulating film 416b positioned on the transistor. The cathode 422 may be formed with aluminum (Al), aluminum alloy (Al alloy), aluminum neodymium (AlNd), etc.

After the cathode 422 is formed, a bank layer 419 for exposing the cathode 422 is formed.

Next, the organic light emitting layer 421 is formed on the cathode 422 (S205).

The organic light emitting layer 421 comprising a hole injection layer, a hole transport layer, a light emitting layer, and an electron injection layer is formed on the cathode 422, but is not limited thereto and may further comprise an electron transport layer.

Hereinafter, each layer comprised in the organic light emitting layer 421 is described.

The hole injection layer performs a function of smoothly injecting a hole and may be formed with at least one selected from a group consisting of 2-TNATA, CuPc(cupper phthalocyanine), PEDOT(poly(3,4)-ethylenedioxythiophene), PANI (polyaniline), and NPD(N,N-dinaphthyl-N,N'-diphenyl benzidine), but is not limited thereto.

The hole transport layer performs a function of smoothly transporting a hole and may be formed with at least one selected from a group consisting of NPB, NPD(N,N-dinaphthyl-N,N'-diphenyl benzidine), TPD(N,N'-bis-(3-methylphenyl)-N,N'-bis-(phenyl)-benzidine), s-TAD, and MTDATA(4,4',4"-Tris (N-3-methylphenyl-N-phenyl-amino)-triphenylamine), but is not limited thereto.

The light emitting layer comprises a material for emitting a red color, a green color, and a blue color and may be formed using a phosphorescent material or a fluorescent material.

When the light emitting layer is formed with a red color, the light emitting layer comprises a host material comprising CBP(carbazole biphenyl) or mCP(1,3-bis(carbazol-9-yl), the light emitting layer may be made of a phosphorescent material comprising a dopant material comprising at least one selected from a group consisting of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), and PtOEP(octaethylporphyrin platinum). Alternatively, the light emitting layer may be made of a fluorescent material comprising PBD:Eu(DBM)3(Phen), or perylene, but is not limited thereto.

When the light emitting layer is formed with a green color, the light emitting layer comprises a host material comprising CBP or mCP, and the light emitting layer may be made of a phosphorescent material comprising a dopant material comprising Ir(ppy)3(fac tris(2-phenylpyridine)iridium). Alternatively, the light emitting layer may be made of a fluorescent material comprising Alq3(tris(8-hydroxyquinolino)aluminum), but is not limited thereto.

When the light emitting layer is formed with a blue color, the light emitting layer comprises a host material comprising CBP or mCP, and the light emitting layer may be made of a phosphorescent material comprising a dopant material comprising (4,6-F2ppy)2Irpic. Alternatively, the light emitting layer may be made of a fluorescent material comprising any one selected from a group consisting of spiro-DPVBi, spiro-6P, distyrylbenzene (DSB), distyrylarylene (DSA), a PFO-based polymer, and a PPV-based polymer, but is not limited thereto.

The electron injection layer performs a function of smoothly injecting an electron and may be made of Alq3(tris(8-hydroxyquinolino)aluminum), PBD, TAZ, spiro-PBD, BAlq, LiF, or SAlq, but is not limited thereto.

The electron transport layer performs a function of smoothly transporting an electron, and may be made of at least one selected from a group consisting of Alq3(tris(8-hydroxyquinolino)aluminum), PBD, TAZ, spiro-PBD, BAlq, and SAlq, but is not limited thereto.

Next, a sub-anode 420 that is formed with a metallic oxide and nickel (Ni) is formed on the organic light emitting layer 421 (S207).

The sub-anode 420 that is formed with a metallic oxide and nickel is formed on the organic light emitting layer 421.

Next, an anode 417 is formed on the sub-anode 420 (S209).

The anode 417 that is formed with the same metallic oxide as that of the sub-anode 420 is formed on the sub-anode 420.

However, the anode 417 may be formed with a metallic oxide of a different kind from that of the sub-anode 420.

The sub-anode 420 is formed with an IZO, i.e. the same metallic oxide as that of the anode 417, but may be formed with a metallic oxide in which nickel is added to an IZO. When the sub-anode 420 is formed in this way, the sub-anode 420 together with the anode 417 can secure low surface resistance and high transmittance characteristics and due to "NiOx" in added nickel, a high work function can be supplied, and thus an injection effect of a hole can be improved.

As described above, in an embodiment of this document, an organic light emitting display and a method of manufacturing the same that can increase a hole injection effect and that can improve current density and luminance characteristics are provided.

The foregoing embodiments and advantages are merely exemplary and are not to be construed as limiting this document. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

The invention claimed is:

1. An organic light emitting display comprising:
a substrate;
an anode that is positioned on the substrate;
a sub-anode that is positioned directly on the anode;
an organic light emitting layer that is positioned directly on the sub-anode; and
a cathode that is positioned directly on the organic light emitting layer,
wherein the anode is formed with a metallic oxide selected from the group consisting of an indium tin oxide (ITO), an indium zinc oxide (IZO), and an indium tin zinc oxide (ITZO),
wherein the sub-anode is formed with the metallic oxide and nickel (Ni) to supply a high work function, and
wherein the sub-anode has a thickness smaller than that of the anode.

2. An organic light emitting display comprising:
a substrate;
a cathode that is positioned on the substrate;
an organic light emitting layer that is positioned directly on the cathode;
a sub-anode that is positioned directly on the organic light emitting layer; and
an anode that is positioned directly on the sub-anode,
wherein the anode is formed with a metallic oxide selected from the group consisting of an indium tin oxide ITO an indium zinc oxide (IZO), and an indium tin zinc oxide (ITZO),
wherein the sub-anode is formed with the metallic oxide and nickel (Ni) to supply a high work function, and
wherein the sub-anode has a thickness smaller than that of the anode.

* * * * *